United States Patent [19]

Fletcher et al.

[11] 4,003,084

[45] Jan. 11, 1977

[54] METHOD OF AND MEANS FOR TESTING A TAPE RECORD/PLAYBACK SYSTEM

[76] Inventors: James C. Fletcher, Administrator of the National Aeronautics and Space Administration, with respect to an invention of; Gabriel R. Wallace, Palm Bay, Fla.; William E. Salter, Palm Bay, Fla.; Glenn D. Weathers, Palm Bay, Fla.; Sidney S. Gussow, Palm Bay, Fla.

[22] Filed: Mar. 25, 1975

[21] Appl. No.: 561,956

Related U.S. Application Data

[62] Division of Ser. No. 419,831, Nov. 28, 1973, Pat. No. 3,875,500.

[52] U.S. Cl. .................................. 360/31; 360/25
[51] Int. Cl.² ........................................ G11B 27/36
[58] Field of Search .............. 360/31, 25, 26, 27, 360/18, 13

[56] References Cited

UNITED STATES PATENTS

| | | | |
|---|---|---|---|
| 2,960,686 | 11/1960 | Gaillard | 360/27 |
| 3,586,965 | 6/1971 | Whysong | 360/31 |
| 3,755,731 | 8/1973 | Young | 360/26 |
| 3,789,377 | 1/1974 | Norris | 360/26 |

Primary Examiner—Jay P. Lucas
Attorney, Agent, or Firm—L. D. Wofford, Jr.; G. J. Porter; J. R. Manning

[57] ABSTRACT

A tape record/playback system is tested by first deriving an analog test signal and a band-limited digital reference signal from a pseudo-noise (PN) sequence generator driven by a clock signal and recording said signals on respective tracks of the system during operation thereof in a record mode. During the playback mode of operation of the system, a delayed analog reference signal without time base variations is reconstructed from the played back reference signal and compared with the played back test signal in order to obtain an error signal that is a measure of the performance of the system.

14 Claims, 5 Drawing Figures

METHOD OF AND MEANS FOR TESTING A TAPE RECORD/PLAYBACK SYSTEM

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

This is a division of application Ser. No. 419,831 filed Nov. 28, 1973 now U.S. Pat. No. 3,875,500.

The present invention relates to a method of and means for testing a tape record/playback system, and more particularly to a test set which measures RMS error, system time delay, correlation function, and system impluse response.

Until recently, the usual practice in end-to-end testing of communication systems has been to feed simple, deterministic signals into the system being tested and note the response. The response was then compared with a delayed and amplitude scaled version of the input signal to enable one to determine the distortion caused by the system and, thus, establish a system figure of merit. Unfortunately, most communication systems experience complex input signals and true simulations of system inputs are difficult to obtain. Even with the approximation of these complex signals (for instance, the sum of a number of independent sine waves), the deterministic approach has often proven unacceptable. Usually the number of component signals were inadequate to truly simulate the normal system input. As a result, beat-frequencies or harmonics effects were often missed and the true system performance was not evaluated. To overcome this deficiency, band-limited noise (usually limited to the same operational bandwidth as the tested system) is now often used as a test signal and represents a very general approach to communication system performance evaluation. Yet, while band-limited noise is an excellent tool with which to simulate realistic data conditions, it has proven difficult to uniformly delay, thereby making valid system input/output comparisons difficult to accomplish.

There are two basic ways to test a system utilizing band-limited noise as a test signal — digital and analog. With the digital approach, band-limited noise is fed into a test system and the output monitored. The system input is sampled and digitized (thereby the digital notation). These digitized samples are compared with digitized samples of the test system output yielding mean square values of the distortion introduced. Constant gain and average delay factors are compensated so that they do not contribute to the distortion introduced by the system being tested since these factors are not usually considered as errors. There are two primary advantages of such a scheme. A complex test signal is used that is similar to the expected operational input spectrum, and all operations after sampling are digital. The primary disadvantages are that quantizing errors exist and that the effects of system spikes, such as FM "clicks," are often still missed.

In the analog system approach, band-limited noise is fed into a test system. The system output is compared on an RMS basis with a delayed and scaled version of the system input. The obvious advantages are that the equipment is compact and relatively simple to build. The largest disadvantage is the difficulty in delaying the complex input without distortion.

SUMMARY OF THE INVENTION

According to the present invention, an analog test signal and a band-limited digital reference signal are derived from a pseudo-noise (PN) sequence generator driven by a clock signal, and these signals, along with a reference clock signal, are recorded on respective tracks of a tape record/playback system during operation thereof in a record mode. During operation of the system in its playback mode, a delayed analog reference signal without time-base variation is reconstructed from the played back reference signals and compared with the played back test signal in order to obtain an error signal that is a measure of the performance of the tape record/playback system. The error signal so obtained is a measure of the RMS error, system time delay, and correlation factor. This error signal can also be used to indicate system impulse response.

Therefore, it is an object of the present invention to provide a method of and means for measuring the operating characteristics of a tape record/playback system.

It is another object of the present invention to provide a test set for measuring very accurately the RMS error of a tape record/playback system.

It is a further object of the present invention to provide a test set for communications systems which is reliable, operationally simple and extremely accurate.

It is still another object of the present invention to provide a test set for a tape record/playback system which measures RMS error, system time delay, correlation function, and system impulse response.

BRIEF DESCRIPTION OF THE DRAWING

Other objects, advantages, and novel features of the invention will become apparent from the following detailed description of the invention when considered in conjunction with the accompanying drawings, in which.

DESCRIPTION OF THE PREFERRED EMBODIMENT

Figure 1:
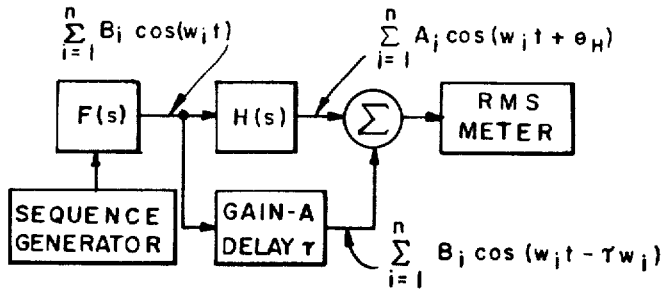
FIG. 1 shows a functional block diagram of the PN test arrangement.

Correctly defined noise signals give a good approximation of the data signals handled by communication systems. The noise signals must be stationary to assure that the measurements are repeatable. Noise can be defined by two unrelated parameters, power spectral density and the amplitude probability density function.

Power spectral density (PSD) describes how the energy in a noise signal is distributed in frequency. Generally, the noise power spectral density, as a function of frequency, can take almost any shape; however, the most common specification is that the power spectral density be constant with frequency. This describes "white" noise.

Probability density function (PDF) of a noise signal is defined as that function which, when integrated over an interval $(X_1, X_2)$, gives the probability that the noise amplitude, $X_N$, lies in the interval $(X_1, X_2)$. Specifically, $$P(X_1 \leq X_n \leq X_2) = \int_{x_1}^{x_2} p(x)dx, \quad (1)$$

and $p(x)$ is the amplitude probability density function, PDF.

True noise data signals are difficult to delay without introducing appreciable distortion. This problem is eliminated by using digitally generated pseudorandom noise signals. PN signals produced by the test set are, in fact, not random but are completely definitive and repetitive. These PN signals closely resemble true random noise signals from both the power spectral density and probability density function aspects.

A pseudorandom binary sequence can be generated by a shift register with an input dependent on feedback from certain register stages. The maximal length (ML) PN binary sequence is of length L and contains $2^N - 1$ bits before repetition of the sequence (where N is the number of register stages).

An important characteristic of pseudorandom sequences is the correlation property. If a binary sequence is pseudorandom, the correlation function of the sequence, and the sequence shifted with respect to itself, is constant for all shifts other than shifts of an integer number of sequence periods. Specifically, if vector A is a sequence $(a_1, a_2, \ldots, a_n)$, and B is a shifted version of this same sequence (with j shifts), then the correlation function (R) is:

$$R(j) = \frac{1}{L} \sum_{i=1}^{L} (a_i \oplus b_i) \quad (2)$$

where the $\oplus$ indicates modulo-2 addition. If the sequence is pseudorandom, $$\begin{aligned} R(j=0) &= 1, \\ R(0 < j < N) &= 1/L, \end{aligned} \quad (3)$$

$$R(j = L) = 1$$
where
$$L = 2^N - 1.$$

This correlation property of a pseudorandom sequence is particularly important because it verifies that the signal generation approximates a random process.

the power spectrum envelope of a PN sequence is a $(\sin X/X)^2$ curve with the first zero occurring at the sequence clock frequency $(\omega_k)$. If the PN sequence is lowpass filtered, with the cutoff frequency $(\omega_o)$ restrained to $\omega_o < \omega_k/15$, then the PDF of the resultant analog signal is approximately Gaussian.

Noise signals generated by lowpass filtering of ML PN sequences are partially described by the cutoff frequency and order of the filter. The specturm amplitude is approximately flat for $\omega < \omega_o$, the envelope is down three decibels (dB) at $\omega_o$. At frequencies greater than $\omega_o$, the envelope rolls off at a rate of 6 m dB/octave (where m is the data filter order). The spectrum is not continuous but consists of closely spaced spectral lines [$\Delta\omega = \omega_k/(2^N - 1)$].

FIG. 1 is a functional block diagram of the PN test arrangement. The filtered PN sequence is represented as a sum of sinusoids, $$\sum_{i=1}^{\infty} B_i \cos(\omega_i t). \quad (4)$$

The filtered sequence is passed through the system with transfer function H(s), and the system output is $$\sum_{i=1}^{\infty} A_i \cos(\omega_i t + \theta_N). \quad (5)$$

A scaled and delayed version of the original analog signal is $$\sum_{i=1}^{\infty} B_i \cos(\omega_i t + \tau\omega_i). \quad (6)$$

The difference between these two complex waveforms is evaluated on an RMS basis by the PN test set to give a figure of merit relating to the system's ability to transfer the complex pseudonoise data signals.

Figure 2:
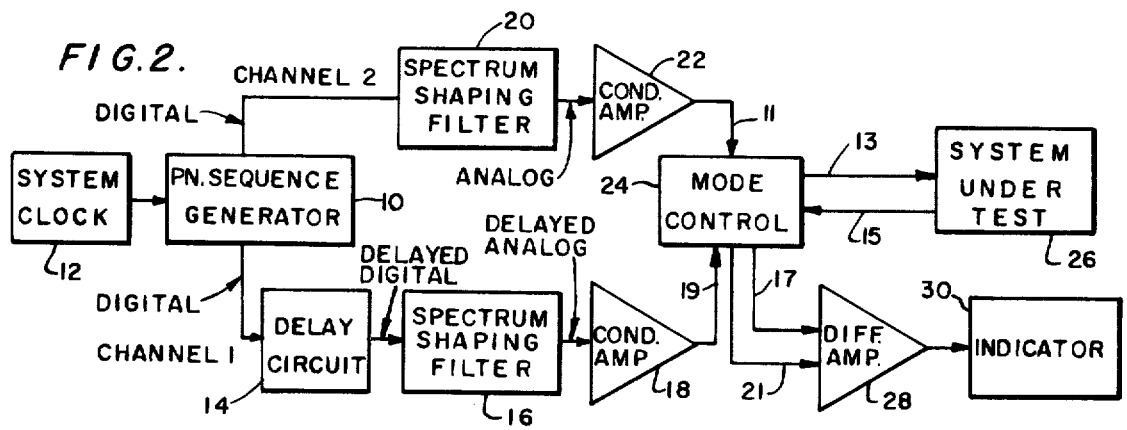
FIG. 2 shows the PN test set block diagram.

Referring now to FIG. 2, a PN sequence generator 10, such as an ML, 20 stage shift register with feedback from taps 17 and 20, is timed by a system clock 12. The clock, which can be an astable multivibrator, is shown as being connected only to the generator 10 for the sake of simplicity; however, it is actually connected to various other circuits throughout the test set to provide timing pulses in the conventional manner. The output of the sequence generator 10 is applied to a pair of signal channels. The first channel includes delay circuit 14, a spectrum shaping filter 16, and a conditioning amplifier 18. The second channel includes a spectrum shaping filter 20 and a conditioning amplifier 22.

The delay circuit uses an incrementally controlled NAND gate matrix for coarse delay selection and a clock vernier for fine delay control. The clock vernier is an adjustable monostable, multivibrator utilizing standard integrated circuitry and discrete, external capacitors. While the delay circuit itself is not unique, its use at this point in the test set is important. The conventional method of adjusting the delay of the test signal to compensate for the average delay of the unit under test is to vary the clock frequency of the data generator until a null is reached. The delay is then a specific number of bits. However, this method is unacceptable with many generators since changing the ratio of the clock frequency to the data shaping filter cutoff frequency changes the statistics of the test signal. In order to keep the ratio within a certain narrow range and ensure near-Gaussian statistics, it is necessary to have a constant clock frequency. Without changing the clock frequency, only a null to within ± ½ bit period of the clock frequency can be achieved unless a vernier time delay adjustment is provided. By using the monostable multivibrator, the delay can be "coarse" nulled to within ± ½ bit period and then nulled to within a small fraction of a bit period by the vernier adjust, which is continuous within a bit period. This permits the effects of the average time delay of the unit under test to be removed and results in lower, more accurate RMS error figures. This is achieved without changing the clock frequency or test signal statistics.

The spectrum shaping filters 16 and 20 are Butterworth active lowpass filters matched to within 0.05 percent. The achievement of this level of matching required a sensitivity analysis of the circuit design, careful attention to component selection, and precise tuning. Five interchangeable plug-in filter sets have been constructed. Four are Butterworth third-order lowpass filters with 3 dB cutoff frequencies at 400 Hz, 500 Hz, 1000 Hz, and 2000 Hz, and one is a first-order lowpass with 3 dB cutoff at 2000 Hz. The cutoff frequencies were selected to provide near-Gaussian test signals with a clock frequency of 45 KHz. Thus, the clock frequency is substantially more than 15 times the cutoff frequency of any of the filters. The filters must be very closely matched because any differences in the signals due to filter mismatch will show up as system distortion, thus causing inaccurate measurements.

Conditioning amplifiers 18 and 22 are conventional amplifiers with gain and DC offset potentiometers.

A mode control 24 is used to provide proper signal paths for the real-time, record, or playback modes. Mode control 24 is a three-position switch with numerous contacts for providing the necessary connections. Its function will be explained as each mode is examined below.

The output signal of amplifier 22 is applied, through the mode control, to the system under test, 26. The system output is applied to one input of difference amplifier 28, which also receives the output of amplifier 18 at its other input. The difference amplifier output is applied to indicator 30.

The operation of the test set has been explained generally by FIG. 1 and the above description of FIG. 2. In the realtime mode the set is connected as in FIG. 2. The test signal on line 11 is directed through mode control 24 to line 13 and applied to system 26. The system output signal on line 15 is directed through mode control 24 to line 17 and applied to difference amplifier 28. The delayed analog signal on line 19, which is to be compared with the system output signal, is applied to difference amplifier 28 through mode control 24 and line 21.

Figure 3A:
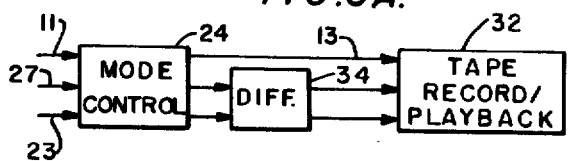
FIGS. 3A and 3B show signal flow diagrams for the record and playback modes.
Figure 3B:
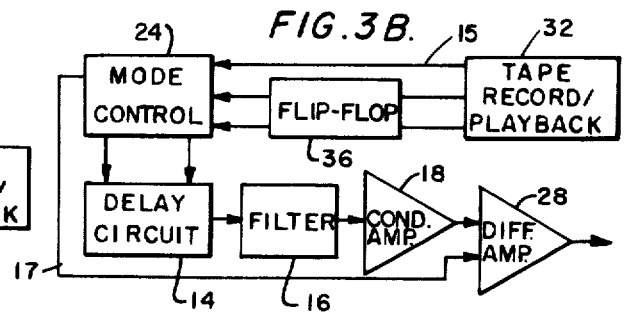

FIGS. 3A and 3B show the signal flow diagrams for the record and playback modes, respectively. The tape record/playback interface has three basic signals to handle; the test signal, or filtered sequence, present on line 11; the clock signal, present on line 27; and the unfiltered PN sequence from generator 10 present on line 23. As described above, the filtered sequence is analog and is the signal the distortion of which will be used to measure the system distortion. The clock signal and PN sequence are both digital. The filtered sequence passes through mode control 24 directly to be recorded on the tape. The clock signal and PN sequence are individually differentiated by differentiator 34 and recorded separately on two other tracks of the tape. These signals are differentiated so that only the times of crossings are recorded, thereby fitting more easily into the available bandwidth of the tape recorder system.

In the playback mode, the system output signal on line 15 (the playback of the recorded filtered sequence) passed through mode control 24 to difference amplifier 28 on line 17. The recorded differentiated clock signal and PN sequence are played back and applied to flip-flop 36. The clock signal triggers the flip-flop to reconstruct the PN sequence. This process removes any removable time-base variations (i.e., wow and flutter) due to the tape recorder from the RMS error figure since the time-base errors introduced on the analog recorded signal are exactly compensated for by the same variations in the clock and PN sequence. The reconstructed clock and PN sequence are passed through mode control 24 to delay circuit 14 where the PN sequence is delayed, filtered, amplified and applied to difference amplifier 28 as the reference signal.

Figure 4:
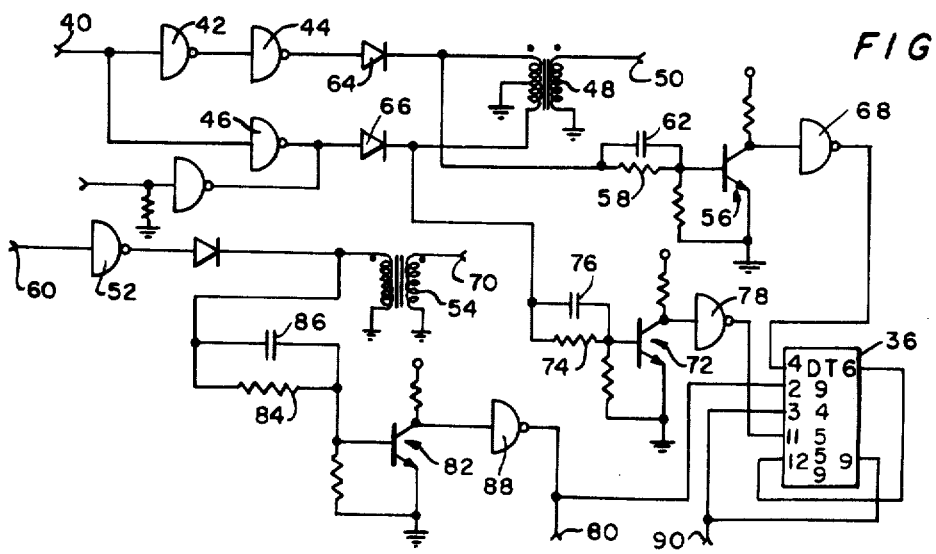
FIG. 4 is a schematic diagram of the record/playback interface circuitry.

FIG. 4 shows the tape record/playback interface in schematic diagram form. Terminal 40 receives the unfiltered PN sequence during the record mode. Integrated circuits (IC) 42, 44 and 46 provide signal shaping and inverting, while the inductance of transformer 48, along with circuit capacitance, provides the differentiating function. The differentiated PN sequence is applied to the tape recorder from terminal 50. The clock signal appears at terminal 60, passes through IC 52 and is differentiated by circuit capacitance and the inductance of transformer 54. The differentiated clock signal is applied to the tape recorder via terminal 70.

In the playback mode, the played-back differentiated PN sequence enters the interface at terminal 50, and passes through transformer 48. Signals of one polarity are applied to the base of transistor 56 through resistor 58 and capacitor 62. Diodes 64 and 66 isolate the played-back differentiated PN sequence from terminal 40, which is disabled during playback mode. The amplified signal from transistor 56 passes through IC 68 to terminal 4 of flip-flop 36. Signals of the other polarity are applied to the base of transistor 72 through resistor 74 and capacitor 76. The amplified signal passes through IC 78 to terminal 11 of flip-flop 36. The replayed differentiated clock signal enters the interface on terminal 70 and is applied to transistor 82 through resistor 84 and capacitor 86. The signal then passes through IC 88 to terminal 80 and flip-flop 36, and is now the reconstructed clock signal. The internal clock 10 is disabled during playback mode, and the clock signals from terminal 80 function as the system clock signals during playback mode. These clock signals, applied to terminal 2 of flip-flop 36, which may be a Fairchild DT 94559, time the flip-flop to reconstruct the PN sequence. The reconstructed PN sequence appears on terminal 90 and is applied to the delay circuit 14. The delay circuit is used here even though it would appear that both the test and PN sequence signals have the same time delay (both are entered into the system under test by being recorded on the tape) because of the slight skew between different tracks on the same tape, and because of possible variations in group delays among the recorded channels. The skew and possible group delay differences cause a slight time difference between tracks which is counteracted by the delay circuit.

The operating procedures for obtaining the various system measurements will now be described. To obtain real-time RMS error measurement due to waveform distortion in a communication system, the indicator 30 is a true-reading RMS voltmeter. With the mode control in the proper position, and the set connected to the system, the conditioning amplifier 22 is adjusted to the correct system dynamic range. The gain of conditioning amplifier 18 and the delay adjustment of delay circuit 14 are then adjusted to obtain a minimum reading on the indicator, the minimum reading being the RMS error. To obtain RMS error measurement on the non-real-time system, the procedure is substantially the same except that the gain of amplifier 22 is adjusted in the record mode and the gain of amplifier 18 and the delay of delay circuit 14 are adjusted for a minimum reading during playback.

To measure system average time delay, it is merely necessary to determine the time delay setting of delay circuit 14 when the indicator 30 is at a minimum reading. The test set provides a delayed clock pulse from the delay circuit. An oscilloscope or counter can be used to measure the distance between the negative going edges of the pulses. This provides a measurement of the vernier time delay and is added to the incremental delay setting to obtain total time delay. In general, any way of measuring the time delay when the RMS meter reading is a minimum can be used.

It has been shown that the correlation maximum occurs at the RMS error minimum and that by measuring the system input, output and minimum RMS error, the correlation of the system is obtained in accordance with the following formula, $$Re_2e_1(\tau) = \frac{1}{2}(e_{1RMS}^2 + e_{2RMS}^2 - e_{RMS}^2)$$

where:
$Re_2e_1(\tau)$ is the correlation;
$e_1$ is the system input voltage;
$e_2$ is the system output voltage;
$e$ is the error voltage.

As is well known in the art, for a linear system the impulse response is proportional to the cross-correlation function. Since the system time delay and system correlation function can be determined as described above, the system impulse response can be calculated in the conventional manner.

Obviously, many modifications and variations of the present invention are possible in light of the above teachings. It is therefore to be understood that, within the scope of the appended claims, the invention may be practiced otherwise than as specifically described.

We claim:
1. A method for testing a tape record/playback system comprising the steps of:
 a. deriving an analog test signal and band-limited digital reference signals from a pseudo-noise sequence generator driven by a reference clock signal;
 b. recording said test signal and said reference signals on respective tracks of the system during operation thereof in a record mode;
 c. playing back the recorded signals during the playback mode of operation of the system;
 d. reconstructing a delayed analog reference signal without time base variations from the played back reference signals; and
 e. comparing the played back test signal with the reconstructed analog reference signal to obtain an error signal that is a measure of the performance of the tape record/playback system.

2. A method according to claim 1 wherein the analog test signal is formed by passing the output of the pseudo-noise sequence generator through a spectrum shaping filter.

3. A method according to claim 2 wherein the band-limited digital reference signals are constituted by a band-limited clock signal and a band-limited pseudo-noise sequence signal derived from the pseudo-noise sequence generator.

4. A method according to claim 3 wherein the band-limited clock signal is obtained by differentiating the clock signal.

5. A method according to claim 4 wherein the band-limited pseudo-noise sequence signal is obtained by differentiating and filtering the output of the pseudo-noise sequence generator.

6. A method according to claim 5 wherein reconstructed clock and reconstructed pseudo-noise sequence signals are developed from the played back band-limited clock signal and the band-limited pseudo-noise sequence signals, and the analog reference signal is developed by delaying the reconstructed pseudo-noise sequence signal and then passing it through a spectrum shaping filter.

7. A method according to claim 6 wherein the delay introduced into the reconstructed pseudo-noise sequence signal is variable.

8. Apparatus for testing a tape record/playback system comprising:
 a. means for driving a pseudo-noise sequence generator by a clock signal for producing a pseudo-noise sequence signal;
 b. means responsive to said pseudo-noise sequence signal for producing an analog test signal, and band-limited digital reference signals;
 c. a two-state mode control means;
 d. means to change said mode control means to a first state for effecting the recording of said test signal and said reference signals on respective tracks of the system;
 e. means to change said mode control means to a second state for effecting the playback of the recorded signals;
 f. means responsive to the played back reference signals for producing a delayed analog reference signal without time base variations; and
 g. comparison means responsive to the played back test signal and the reconstructed analog reference signal for obtaining an error signal that is a measure of the performance of the tape record/playback system.

9. A test set according to claim 8 including a spectrum shaping filter responsive to the output of the pseudo-noise sequence generator for forming the analog test signal.

10. A test set according to claim 9 including means responsive to the output of the pseudo-noise sequence generator and the clock signal for producing a band-limited clock signal and a band-limited pseudo noise sequence signal, the last two mentioned signals constituting the band-limited digital reference signals.

11. A test set according to claim 10 including means for differentiating and filtering the clock signal for forming the band-limited clock signal.

12. A test set according to claim 11 including means for differentiating and filtering the pseudo-noise sequence signal for forming the band-limited pseudo-noise sequence signal.

13. A test set according to claim 12 including means responsive to the played back band-limited clock signal and pseudo-noise sequence signals for reconstructing the clock and the pseudo-noise sequence signals, means for delaying the reconstructed pseudo-noise sequence signal, and means for passing the delayed pseudo-noise sequence signal through a spectrum shaping filter for producing said delayed analog reference signal without time base variations.

14. A test set according to claim 8 wherein said comparison means measures the RMS difference between the played back test signal and the reconstructed analog reference signal whereby said RMS difference is a measure of signal distortion resulting from all sources of signal distortion except for that signal distortion caused by time-base errors occuring during the record/playback process.

* * * * *

UNITED STATES PATENT AND TRADEMARK OFFICE
CERTIFICATE OF CORRECTION

PATENT NO. : 4,003,084

DATED : January 11, 1977

INVENTOR(S) : James C. Fletcher, Administrator of NASA, with respect to an invention of: Gabriel R. Wallace et al It is certified that error appears in the above-identified patent and that said Letters Patent are hereby corrected as shown below:

On the cover sheet, in the heading to the printed specification, section [76] should read as follows:

-- 76   James C. Fletcher, Administrator of the National Aeronautics and Space Administration, with respect to an invention of: Gabriel R. Wallace, Huntsville, Alabama; William E. Salter, Huntsville, Alabama; Glenn D. Weathers, Huntsville, Alabama; Sidney S. Gussow, Palm Bay, Florida. --

Signed and Sealed this fifth Day of July 1977

[SEAL]

*Attest:*

RUTH C. MASON
*Attesting Officer*

C. MARSHALL DANN
*Commissioner of Patents and Trademarks*